United States Patent
Lin

(10) Patent No.: US 11,711,896 B2
(45) Date of Patent: Jul. 25, 2023

(54) ELECTRONIC DEVICE AND MANUFACTURING METHOD THEREOF

(71) Applicant: InnoLux Corporation, Miao-Li County (TW)

(72) Inventor: Chun-Hsien Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 202 days.

(21) Appl. No.: 17/111,486

(22) Filed: Dec. 3, 2020

(65) Prior Publication Data

US 2022/0140185 A1 May 5, 2022

(30) Foreign Application Priority Data

Oct. 29, 2020 (CN) .......................... 202011186128.3

(51) Int. Cl.
*H01L 33/24* (2010.01)
*H05K 3/30* (2006.01)
(Continued)

(52) U.S. Cl.
CPC ......... *H05K 3/303* (2013.01); *H01L 25/0753* (2013.01); *H01L 33/005* (2013.01);
(Continued)

(58) Field of Classification Search
CPC ... H01L 33/24; H01L 25/0753; H01L 33/005; H01L 2224/2929; H01L 2224/293; H01L 2224/32225; H01L 2224/75705; H01L 2224/83; H01L 2224/83002; H01L 2224/8314; H01L 2224/83141;
(Continued)

(56) References Cited

U.S. PATENT DOCUMENTS 9,917,226 B1 3/2018 Heine
2017/0372927 A1 12/2017 Schuele
(Continued)

FOREIGN PATENT DOCUMENTS

CN 111370541 A 7/2020
JP 2004-22846 1/2004
TW 201826490 A 7/2018

*Primary Examiner* — Mark W Tornow
*Assistant Examiner* — Dmitriy Yemelyanov
(74) *Attorney, Agent, or Firm* — Winston Hsu

(57) ABSTRACT

An electronic device is provided, the electronic device includes a driving substrate, the driving substrate includes a plurality of circular grooves and a plurality of rectangular grooves, a plurality of disc-shaped light-emitting units, at least one disc-shaped light-emitting unit is disposed in at least one circular groove, and the at least one disc-shaped light-emitting unit includes an alignment element positioned on a top surface of the at least one disc-shaped light-emitting unit, a diameter of the at least one disc-shaped light-emitting unit is defined as R, a diameter of the alignment element is defined as r, a width of at least one rectangular groove among the rectangular grooves is defined as w, and a height of the at least one rectangular groove is defined as H, and the at least one disc-shaped light-emitting unit and the at least one rectangular groove satisfy the condition of $(R+r)/2 > (w^2+H^2)^{1/2}$.

5 Claims, 6 Drawing Sheets

(51) Int. Cl.
    *H05K 1/18*      (2006.01)
    *H01L 25/075*    (2006.01)
    *H01L 33/00*     (2010.01)

(52) U.S. Cl.
    CPC ............. *H01L 33/24* (2013.01); *H05K 1/181* (2013.01); *H05K 2201/10106* (2013.01); *H05K 2201/10166* (2013.01); *H05K 2201/10174* (2013.01)

(58) Field of Classification Search
    CPC ....... H01L 2224/83191; H01L 2224/95; H01L 2224/95001; H01L 2224/95085; H01L 2224/95101; H01L 2224/95136; H01L 24/29; H01L 24/32; H01L 24/83; H01L 24/95; H01L 25/50; H01L 2924/00012; H01L 2924/00014; H01L 2924/10156; H01L 2924/12041; H01L 2924/12044; H01L 2924/15153; H01L 33/0095; H01L 33/20; H01L 33/38
    See application file for complete search history.

(56) References Cited

U.S. PATENT DOCUMENTS

| | | | |
|---|---|---|---|
| 2019/0006564 A1* | 1/2019 | Sasaki | H01L 21/561 |
| 2020/0152826 A1 | 5/2020 | Lee | |

\* cited by examiner

ELECTRONIC DEVICE AND MANUFACTURING METHOD THEREOF

BACKGROUND OF THE DISCLOSURE

1. Field of the Disclosure

The present disclosure relates to an electronic device, in particular to a method for manufacturing an electronic device by mounting light-emitting units by a fluid assembly procedure.

2. Description of the Prior Art

As an essential component of electronic devices or light-emitting devices, light-emitting units are widely used in electronic products, such as mobile phones, tablet computers, automotive displays and so on. When the circuit of the driving substrate of an electronic device or a light emitting device is completed, a large number of light-emitting units can be mounted on the driving substrate by using a fluid assembly procedure. However, because the fluid is difficult to control, the stability of the assembly procedure using the fluid needs to be improved. For example, some light-emitting units may not be mounted in the pixel region on the driving substrate and cause defects. Therefore, it is necessary to provide a repair method of the light-emitting unit to improve the yield of mounting the light-emitting unit on the driving substrate.

SUMMARY OF THE DISCLOSURE

An electronic device is provided, the electronic device includes a driving substrate, the driving substrate includes a plurality of circular grooves and a plurality of rectangular grooves, and a plurality of disc-shaped light-emitting units, at least one disc-shaped light-emitting unit of the plurality of disc-shaped light-emitting units is disposed in at least one circular groove of the plurality of circular grooves, and the at least one disc-shaped light-emitting unit comprises an alignment element positioned on a top surface of the at least one disc-shaped light-emitting unit, a diameter of the at least one disc-shaped light-emitting unit is defined as R, a diameter of the alignment element is defined as r, a width of at least one rectangular groove among the rectangular grooves is defined as w, and a height of the at least one rectangular groove is defined as H, and the at least one disc-shaped light-emitting unit and the at least one rectangular groove satisfy the condition of $(R+r)/2 > (w^2+H^2)^{1/2}$.

In some embodiment of the present disclosure, a manufacturing method of an electronic device is provided, the method including: a driving substrate which includes a plurality of circular grooves and a plurality of rectangular grooves is provided, a plurality of disc-shaped light-emitting units are mounted in the plurality of circular grooves by a fluid assembly procedure, at least one disc-shaped light-emitting unit of the disc-shaped light-emitting units includes an alignment element which is positioned on a top surface of the at least one disc-shaped light-emitting unit, a diameter of the at least one disc-shaped light-emitting unit is defined as R, a diameter of the alignment element is defined as r, a width of at least one rectangular groove is defined as w, a height of the at least one rectangular groove is defined as H, and the at least one disc-shaped light-emitting unit and the at least one rectangular groove satisfy the condition of $(R+r)/2 > (w^2+H^2)^{1/2}$.

According to some embodiments, the present disclosure is characterized in that grooves of different shapes are formed on the driving substrate of the electronic device, which respectively correspond to different shapes of light-emitting units and different mounting methods. For example, a large number of disc-shaped light-emitting units are mounted in circular grooves by a fluid assembly procedure, and then a small number of rectangular light-emitting units are mounted in some rectangular grooves by a pick-and-place procedure, so as to achieve the effect of repairing defects. In addition, because the disclosure defines the size relationship between the rectangular groove and the disc-shaped light-emitting unit, the possibility that the disc-shaped light-emitting unit falls into the rectangular groove in the fluid assembly procedure can be reduced, and the manufacturing efficiency can also be improved.

These and other objectives of the present disclosure will no doubt become obvious to those of ordinary skill in the art after reading the following detailed description of the embodiment that is illustrated in the various figures and drawings.

DETAILED DESCRIPTION

Figure 1:
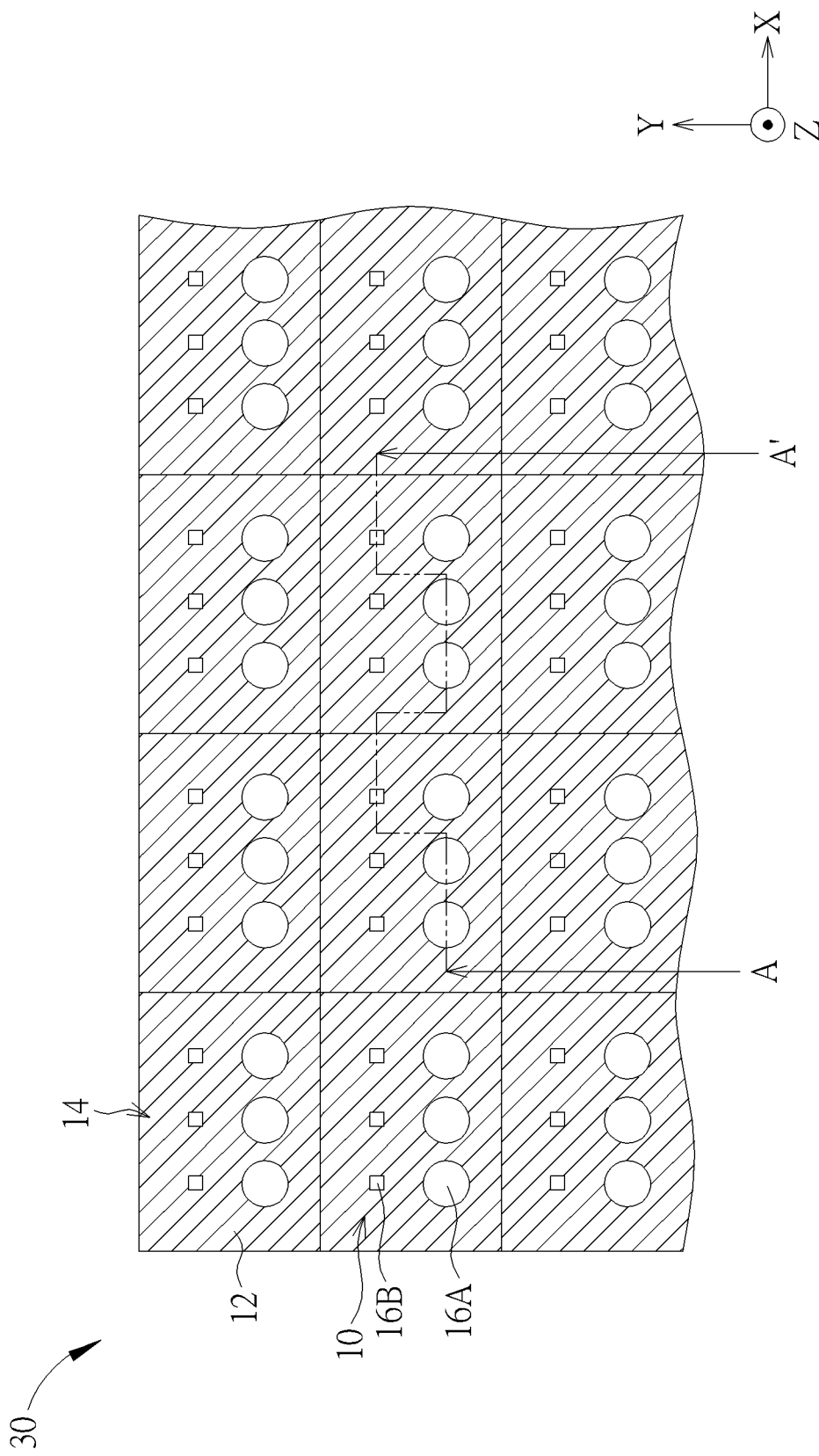
FIG. 1 is a schematic top view of a driving substrate of an electronic device of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device (i.e. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be understood that when an element or film is defined as being disposed on or connected to another element or film, it can be directly on or connected to this other element or film, or there are other intervening elements or films between them (non-direct contact). On the contrary, when a component is defined as "directly" on or "directly connected" to another component or film, there is no intervening component or film between them.

The terms "about", "substantially", "equal", or "same" generally mean within 20% of a given value or range, or mean within 10%, 5%, 3%, 2%, 1%, or 0.5% of a given value or range.

In addition, the phrase "in a range from a first value to a second value" indicates the range includes the first value, the second value, and other values in between.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device disclosed in the present disclosure can include, for example, a display device, an antenna device, a sensing device, a touch display, a curved display or a free shape display, and can also be a bendable or flexibly spliced electronic device, but is not limited thereto. Electronic device may include, for example, light emitting diodes, liquid crystal, fluorescence, phosphorescence, quantum dot (QD), other suitable display media, or combinations of the foregoing, but are not limited thereto. The light-emitting diode (LED) may include, for example, an organic light-emitting diode (OLED), inorganic light-emitting diode, mini light-emitting diode (mini LED), micro light-emitting diode (micro LED) or quantum dot light-emitting diode (QDLED), or other suitable materials or any arrangement and combination of the above, but not limited thereto. The antenna device can be, for example, a liquid crystal antenna, but is not limited thereto. It should be noted that the electronic devices disclosed in this disclosure can be any combination of the above, but are not limited thereto. In addition, the appearance of the electronic device can be rectangular, circular, polygonal, with curved edges or other suitable shapes. An electronic device may have peripheral systems such as a driving system, a control system, a light source system, a shelf system, etc. to support a display device or an antenna device. The following is an example of a display device.

Figure 2:
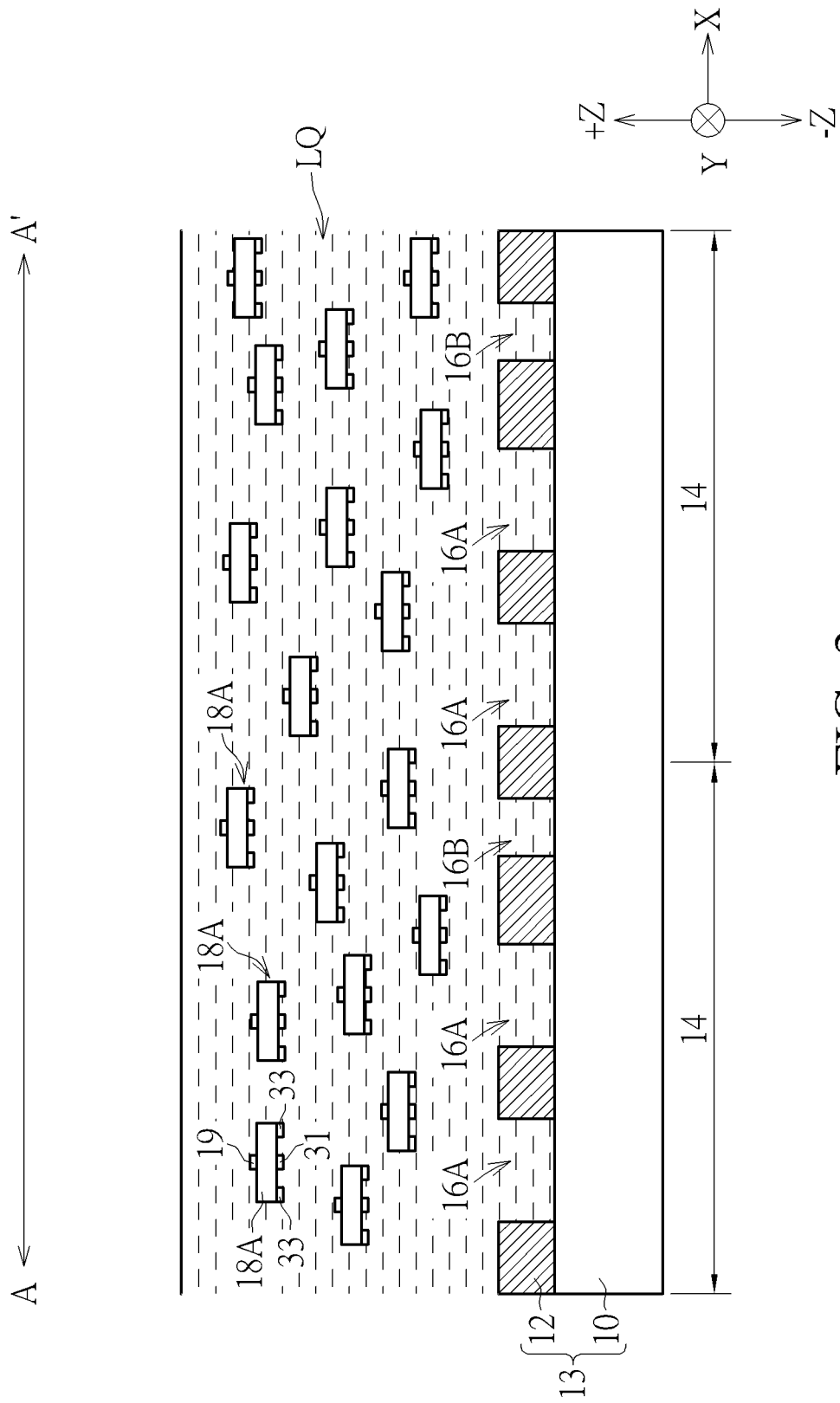
FIG. 2 shows a schematic cross-sectional view of mounting a large number of disc-shaped light-emitting units on a driving substrate by a fluid assembly procedure.

FIG. 1 shows a schematic top view of a driving substrate 13 of an electronic device 30 of the present disclosure, and FIG. 2 shows a schematic cross-sectional view along a section line A-A' in FIG. 1, in which a plurality of disc-shaped light-emitting units 18A are about to be mounted on the driving substrate 13 by a fluid assembly procedure. With reference to FIG. 1 and FIG. 2, a supporting substrate 10 is provided, the supporting substrate 10 can be made of glass, sapphire, polyimide (PI), polycarbonate (PC), polyethylene naphthalate (PEN), triacetate (TAC), polyethylene terephthalate (PET). The supporting substrate 10 can be a hard substrate or a flexible substrate, and this disclosure is not limited thereto. The supporting substrate 10 may be a single layer or a multiple layers structure, and the present disclosure is not limited thereto. In this embodiment, a buffer layer (not shown) and a circuit layer (not shown) can be disposed on the supporting substrate 10, and the circuit layer can also be directly disposed on the supporting substrate. The material of the buffer layer can include inorganic materials such as silicon nitride layer and silicon oxide layer. The circuit layer is disposed on the supporting substrate, and can include various traces (such as but not limited to gate lines, signal lines, power lines) and electronic components (such as but not limited to thin film transistors and capacitors), and can be used for connecting light-emitting units (such as LEDs, etc.) formed later.

To simplify the drawing, the circuit layer and buffer layer of the supporting substrate 10 are omitted in this disclosure. In this disclosure, a pixel definition layer (PDL) 12 may be disposed on the supporting substrate 10, and the PDL 12 includes a plurality of grooves (openings) which are arranged to define a plurality of pixel regions 14. In this disclosure, the supporting substrate 10 and the pixel defining layer 12 can be combined and defined as a driving substrate 13, and the driving substrate 13 can also include the buffer layer and the circuit layer described above. The groove described here is used to accommodate the light-emitting unit in the subsequent process. That is, the driving substrate 13 includes a plurality of openings (grooves). FIG. 1 shows a plurality of pixel regions 14, and at least one circular groove 16A and at least one rectangular groove 16B are disposed in at least one pixel region 14. As shown in FIGS. 1 and 2, the driving substrate 13 is placed on the XY plane, and the pixel defining layer 12 is disposed above the supporting substrate 10 in the Z direction. The X direction, the Y direction and the Z direction can be perpendicular to each other. The pixel region 14 may be an area where one or more light-emitting units are mounted in the subsequent process, for example, a blue (B) light-emitting unit may be included in the pixel region 14, and parts of the blue light may be converted into other colors (for example, red (R) or green (G)) by means of quantum dot (QD) conversion and/or color filter (CF) in the subsequent process, but not limited to this. Specifically, according to some embodiments, at least one circular groove 16A and at least one rectangular groove 16B may be provided in each pixel region 14. According to some embodiments, a plurality of circular grooves 16A and a plurality of rectangular grooves 16B may be provided in each pixel region 14. FIG. 1 shows that three circular grooves 16A and three rectangular grooves 16B are provided in a pixel region 14 as an example, but not limited to this. The circular groove 16A is used to accommodate the disc-shaped light-emitting unit (not shown in FIG. 1) subsequently mounted on the driving substrate 13, while the rectangular groove 16B is used to accommodate the rectangular light-emitting unit (not shown in FIG. 1) subsequently mounted on the driving substrate 13.

The light-emitting units (including disc-shaped light-emitting units or rectangular light-emitting units) described in this disclosure are, for example, light-emitting diodes, which may include inorganic light-emitting diodes (such as quantum dot LED, mini light-emitting diodes (mini LED), micro light-emitting diodes (micro LED) or nano light-emitting diodes (nano LED), and this disclosure is not limited thereto. The pixel defining layer 12 may comprise suitable insulating materials, such as silicon oxide, silicon nitride, silicon oxynitride, organic insulating layer or any other suitable insulating materials or combinations thereof, but is not limited thereto.

Please refer to FIG. 2, which shows a schematic cross-sectional view of mounting a large number of disc-shaped light-emitting units 18A on the driving substrate 13 by a fluid assembly (FA) procedure. Firstly, a large number of disc-shaped light-emitting units 18A are placed in the fluid LQ, and a plurality of disc-shaped light-emitting units 18A are mounted in the circular grooves 16A by the fluid assembly procedure during the flowing process. Specifically, each disc-shaped light-emitting unit 18A can fall into each circular groove 16A, so that each disc-shaped light-emitting unit 18A is mounted on the driving substrate 13 and electrically connected with the aforementioned circuit layer. According to some embodiments, the size of the circular groove 16A may be larger than that of each disc-shaped light-emitting unit 18A, and thus the disc-shaped light-emitting unit 18A may be accommodated in the circular groove 16A.

Figure 3A:
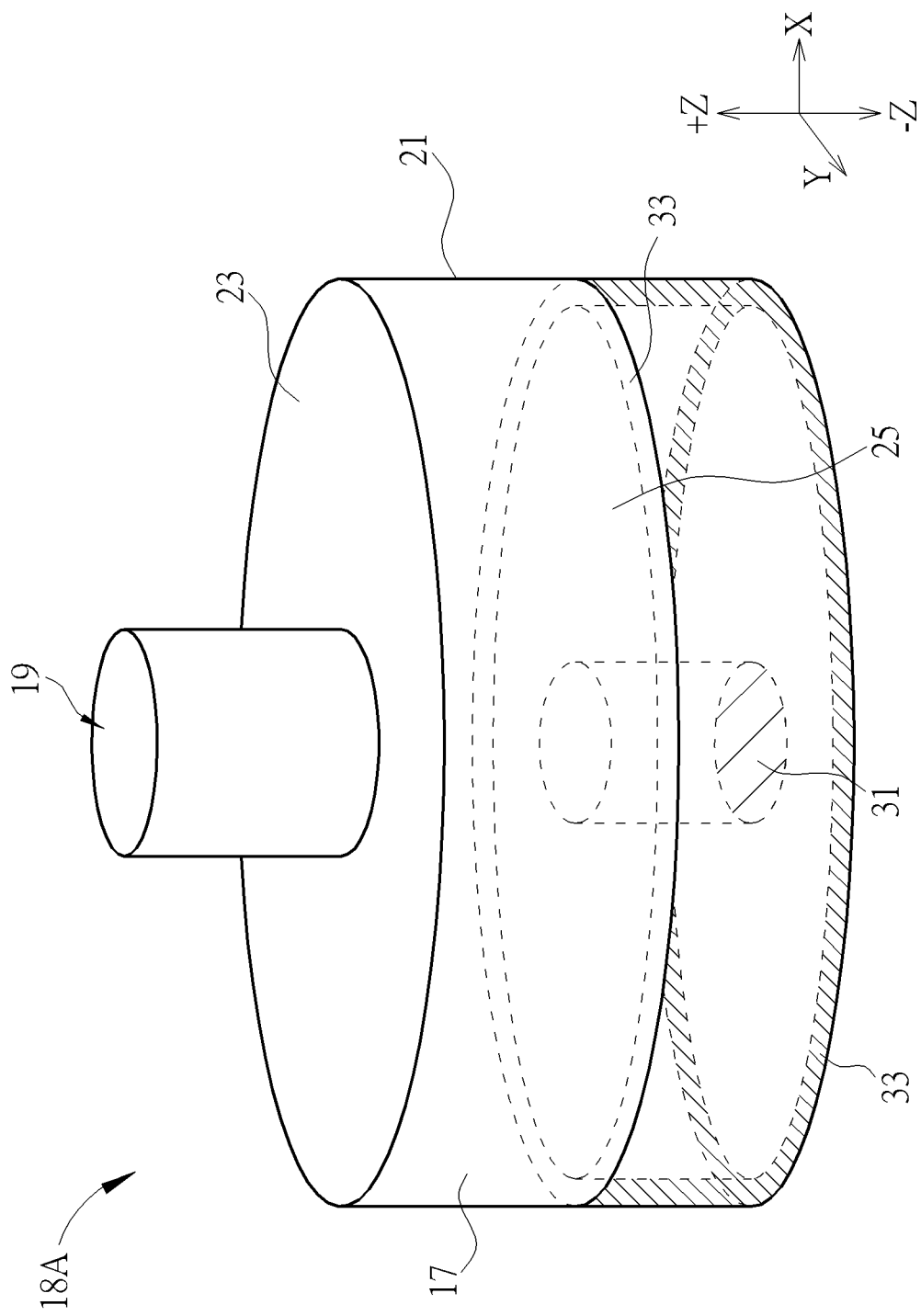
FIG. 3A is a schematic perspective view of a disc-shaped light-emitting unit.
Figure 3B:
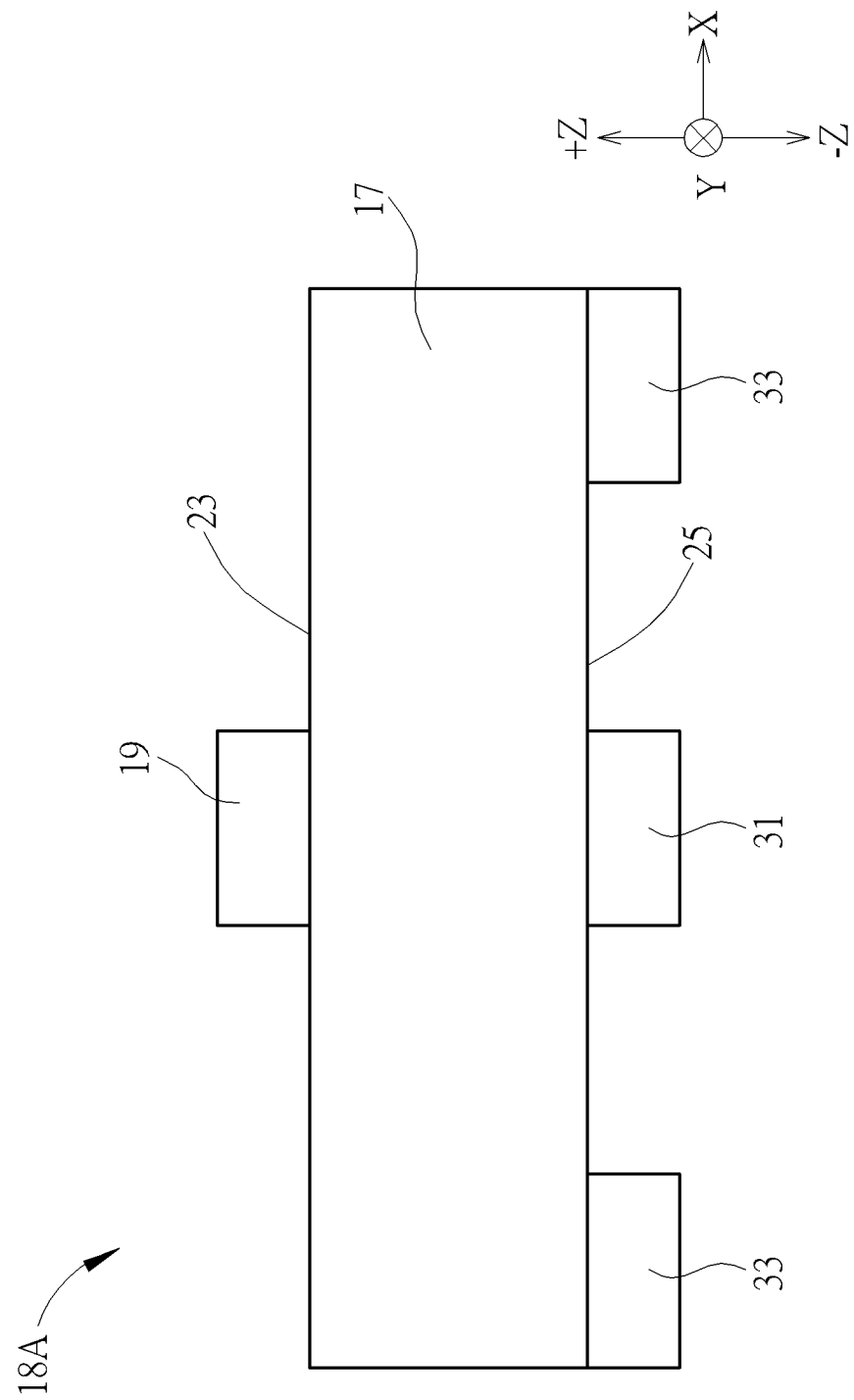
FIG. 3B is a schematic cross-sectional view of a disc-shaped light-emitting unit.

Please refer to FIG. 2, FIG. 3A and FIG. 3B. FIG. 3A is a schematic perspective view of a disc-shaped light-emitting unit 18A, and FIG. 3B is a cross-sectional view of the disc-shaped light-emitting unit 18A. In the present disclosure, each disc-shaped light-emitting unit 18A has a dish-shaped structure or a disc-shaped structure, for example, it has a circular shape when viewed from the top (or may have an oval shape in other embodiments). The disc-shaped light-emitting unit 18A includes a main body 17, an alignment element 19, a first electrode 31 and a second electrode 33. The main body 17 has a top surface 23, a bottom surface 25 and a side surface 21, and the side surface 21 is disposed between and connects the top surface 23 and the bottom surface 25. An alignment element (which can be also called as a post) 19 is disposed on the top surface 23 of the main body 17. The first electrode 31 and the second electrode 33 may be disposed on the bottom surface 25 of the main body 17. For example, the first electrode 31 may be disposed at a middle position of the bottom surface 25, and the second electrode 33 may be disposed at a peripheral position of the bottom surface 25. For example, the second electrode 33 may be disposed around the first electrode 31 and may surround the first electrode 31, but the present disclosure is not limited thereto. The first electrode 31 and the second electrode 33 may be conductive materials, for example, metal. The first electrode 31 and the second electrode 33 can be used to electrically connect the disc-shaped light-emitting unit 18A and the driving substrate 13. According to some embodiments, bonding pads (not shown) may be disposed below the first electrode 31 and the second electrode 33 (negative Z direction shown in FIG. 2) to facilitate the electrical connection between the disc-shaped light-emitting unit 18A and the driving substrate 13. According to some embodiments, the bonding pad may be disposed between the first electrode 31 and the driving substrate 13, or/and may be disposed between the second electrode 33 and the driving substrate 13. The bonding pad is, for example, conductive adhesive. The alignment element 19 can be a substance with a specific density, which can help the disc-shaped light-emitting unit 18A to maintain and fix its vertical direction when flowing in the fluid. For example, the alignment element 19 may be made of a substance having a density lower than that of the fluid LQ, so that when the disc-shaped light-emitting unit 18A flows in the fluid, the alignment element 19 is easily maintained above the main body 17 of the disc-shaped light-emitting unit 18A (positive Z direction in FIG. 2), and the first electrode 31 and the second electrode 33 are easily maintained below the main body 17 of the disc-shaped light-emitting unit 18A (negative Z direction in FIG. 2). The disc-shaped light-emitting unit 18A is maintained in this direction, and it is easy to mount the disc-shaped light-emitting unit 18A into each circular groove 16A, and it is not easy to turn over the disc-shaped light-emitting unit 18A. According to some embodiments, the disc-shaped light-emitting unit 18A may have a circular shape. According to some embodiments, the disc-shaped light-emitting unit 18A may have an oval shape or an ellipse shape.

With the above-described fluid assembly procedure, a plurality of disc-shaped light-emitting units 18A can be quickly or massively mounted on the driving substrate 13. However, because fluid is not easy to control, the accuracy of the fluid assembly procedure is slightly insufficient. In this way, some circular grooves 16A in some pixel regions 14 may not be mounted with the disc-shaped light-emitting units 18A, or the number of disc-shaped light-emitting units 18A which has been mounted in is insufficient, or some of the disc-shaped light-emitting units 18A are not connected with the circuit layer, which can be called defects in the pixel regions. The defects will cause the pixel region of the electronic device to be not bright or have insufficient brightness.

In order to reduce the occurrence probability of the defects in the above pixel regions, in some embodiments, it is designed that each pixel region 14 of the driving substrate 13 in this disclosure includes at least one circular groove 16A (for accommodating the disc-shaped light-emitting unit 18A) and at least one rectangular groove 16B. The purpose of forming the rectangular groove 16B is to repair the defects in the pixel regions. In addition, the rectangular groove 16B described here can be rectangular or square, and the present disclosure is not limited to this.

Figure 4:
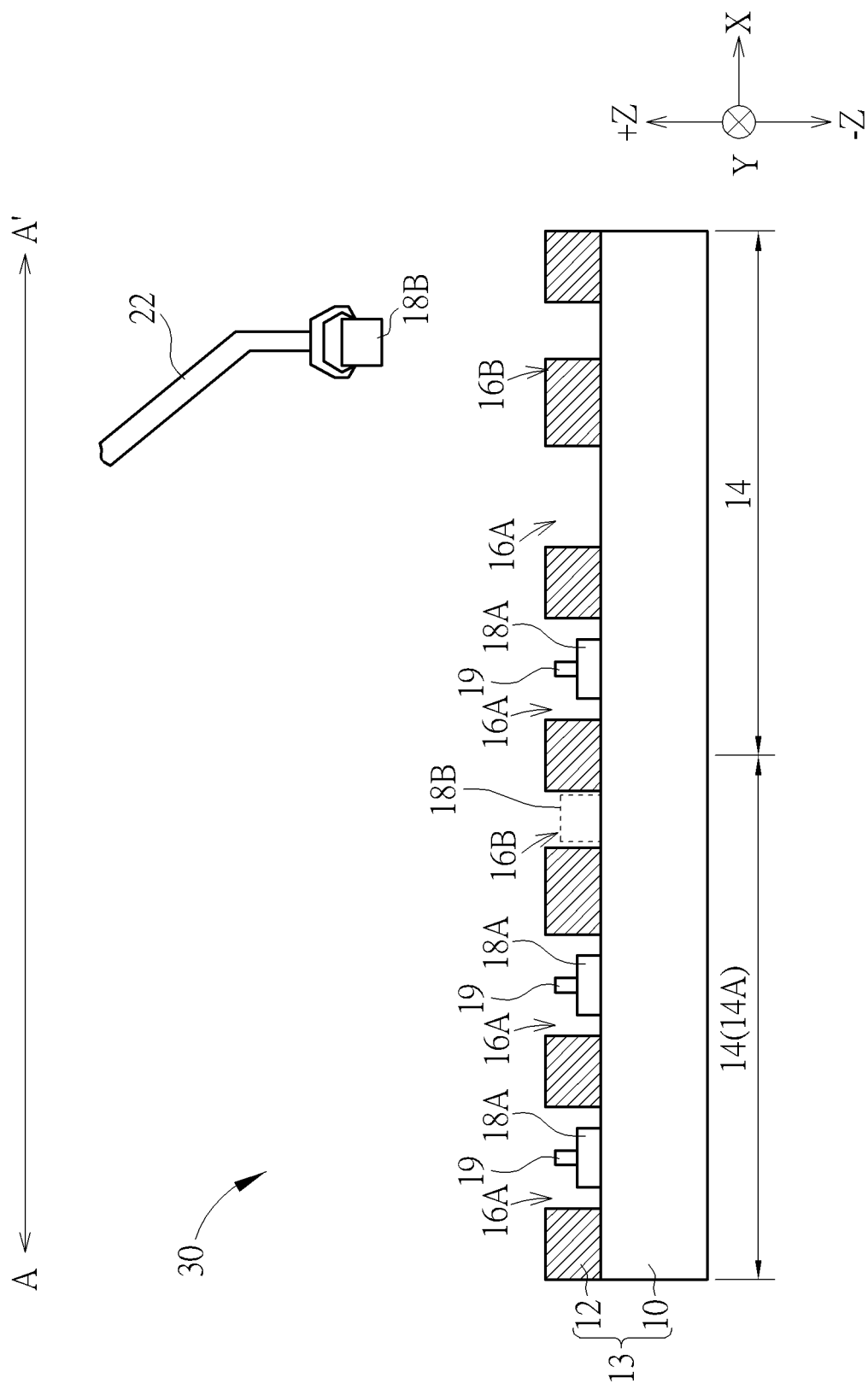
FIG. 4 shows a schematic cross-sectional view of mounting some rectangular light-emitting units on a driving substrate by a pick-and-place procedure.

Please refer to FIG. 4, which shows a partial cross-sectional view of the electronic device 30 according to the present disclosure along the section line A-A' shown in FIG. 1. FIG. 4 shows that part of the rectangular light-emitting units 18B are mounted on the driving substrate 13 by a pick-and-place procedure. The rectangular light-emitting units 18B can be of rectangular shape, or square shape. As shown in FIG. 4, some circular grooves 16A in some pixel regions 14 may not be mounted with the disc-shaped light-emitting units 18A, or the number of the disc-shaped light-emitting units 18A is insufficient, or some of the disc-shaped light-emitting units 18A are not connected to the circuit layer. For example, as shown in FIG. 4, there are two circular grooves 16A and one rectangular groove 16B in the pixel region 14A. The two disc-shaped light-emitting units 18A are respectively mounted in the two circular grooves 16A, while the rectangular groove 16B is empty, and no light-emitting unit is mounted in the rectangular groove 16B. Specifically, the two disc-shaped light-emitting units 18A are respectively mounted in the two circular grooves 16A and electrically connected with the driving substrate 13. The absence of light-emitting units in the rectangular grooves 16B can be regarded as a defect in the pixel region 14A. Therefore, after the above-mentioned fluid assembly procedure is performed, a repair procedure can be further performed to repair the above-mentioned defects. According to some embodiments, the position of the defect in the pixel region 14A can be detected, and then the defect position can be repaired. For example, each disc-shaped light-emitting unit 18A can be driven to emit light, and pixel regions that are not bright or have insufficient brightness can be found by taking pictures and observing, and then these pixel regions can be repaired by pick-and-place procedure.

Furthermore, as shown in FIG. 4, one or several rectangular light-emitting units 18B can be clamped by a robot arm 22, a suction nozzle, or by other methods, and placed in rectangular grooves 16B in parts of the pixel regions 14, so as to supplement the number or color of the light-emitting units in the pixel region 14, and achieve the purpose of repairing the pixel region 14. Specifically, in the pixel region 14A, the rectangular light-emitting unit 18B can be placed in the empty rectangular groove 16B by the above-mentioned pick-and-place procedure, so that the rectangular light-emitting unit 18B is electrically connected with the driving substrate 13. That is, the rectangular grooves 16B are used as spare spaces for repairing the light-emitting units. In FIG. 4, a rectangular light-emitting unit 18B is shown by a broken line, which means that the rectangular light-emitting unit 18B is placed in the rectangular groove 16B. The step which the rectangular light-emitting unit 18B is placed may be later than the step which the disc-shaped light-emitting unit 18A is placed. In the electronic device 30 shown in FIG. 4, in the pixel region 14A, at least one disc-shaped light-emitting unit 18A is disposed in at least one circular groove 16A, and at least one rectangular light-emitting unit 18B is disposed in at least one rectangular groove 16B.

After mounting enough light-emitting units (including the disc-shaped light-emitting units 18A and the rectangular light-emitting units 18B) in each pixel area 14, other steps may be performed subsequently, such as removing alignment elements 19, and then forming other elements, including a color filter, a passivation layer, a quantum dot conversion layer, or combinations thereof. That is, the electronic device 30 of the present disclosure may include a color filter, a passivation layer, a quantum dot conversion layer, and combinations thereof. These elements and their manufacturing methods belong to the conventional technology in the field, so they will not be described in detail here.

According to some embodiments, the fluid assembly procedure shown in FIG. 2 is performed to mount a large number of disc-shaped light-emitting units 18A into circular grooves 16A on the driving substrate 13. In this process, the probability that the disc-shaped light-emitting unit 18A falls into the rectangular groove 16B can be reduced, so as to avoid the difficulty of repairing the defects in the pixel region. That is, if the disc-shaped light-emitting unit 18A falls into the rectangular groove 16B, it is difficult to put the rectangular light-emitting unit 18B into the rectangular groove 16B when the pick-and-place procedure shown in FIG. 4 is performed.

Therefore, in order to reduce the possibility that the disc-shaped light-emitting unit 18A falls into the rectangular groove 16B during the fluid assembly procedure, some embodiments of this disclosure have special designs for the size relationship between the disc-shaped light-emitting unit 18A and the rectangular groove 16B. Please refer to FIG. 5, which depicts the size relationship between a disc-shaped light-emitting unit 18A and a rectangular groove 16B. If the disc-shaped light-emitting unit 18A is disc-shaped, the diameter of the disc-shaped light-emitting unit 18A is defined as R (refer to the position of diameter R in FIG. 5, that is, the diameter of the dish/disc shaped main body 17, the maximum straight line length passing through the center of the circle, or the shortest distance between two parallel tangent lines). The top surface 23 or the bottom surface 25 of the disc-shaped light-emitting unit 18A is a circle, and the distance passing through the center of the circle is the diameter. For example, in FIG. 6, the top surface 23 of the disc-shaped light-emitting unit 18A is a circle, and the distance passing through the center of the circle is the diameter R.

Figure 5:
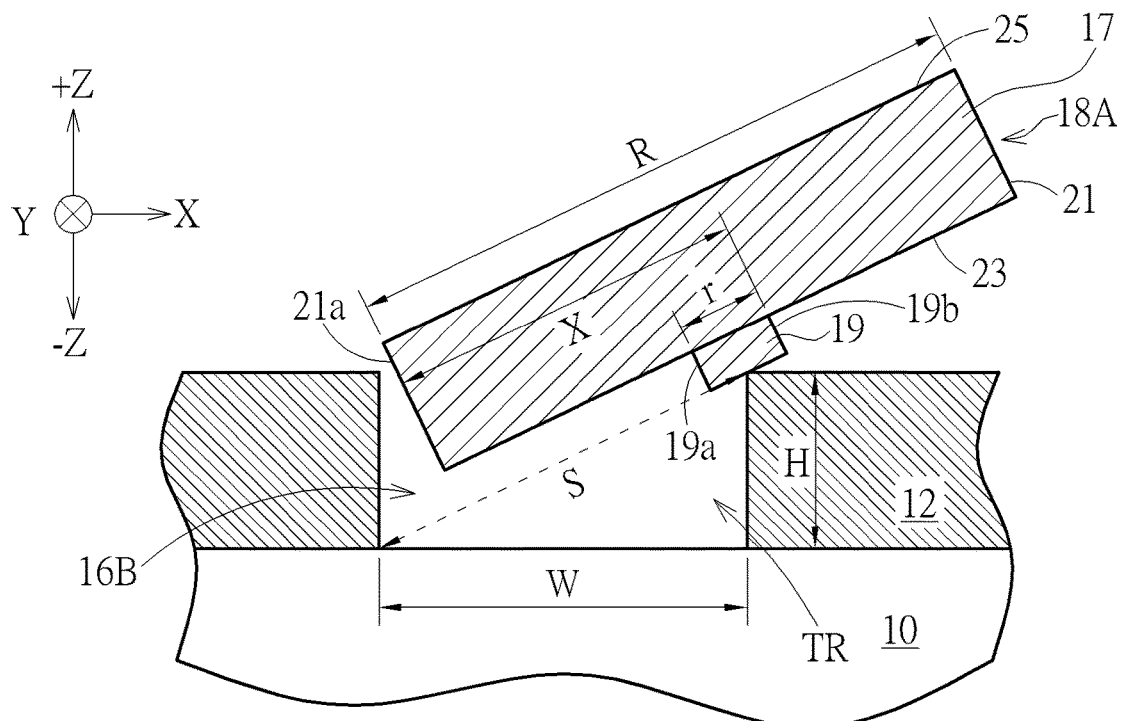
FIG. 5 shows a schematic diagram of the dimensional relationship between a disc-shaped light-emitting unit and a rectangular groove.

If the disc-shaped light-emitting unit 18A is an elliptical disk shaped structure, R may be the length of the long axis of the disc-shaped light-emitting unit 18A. The diameter of the alignment element 19 is defined as r, the width of the rectangular groove 16B is defined as W (e.g., the bottom length of one side of the rectangular groove 16B as shown in FIG. 5), and the depth of the rectangular groove 16B is defined as H (i.e., the vertical distance from the top surface of the pixel definition layer 12 to the top surface of the support substrate 10 as shown in FIG. 5). When the rectangular groove 16B is rectangular, the width W of the rectangular groove 16B is the length of the shorter side on the XY plane. A depth H of the rectangular groove 16B is a depth in the Z direction. In addition, from the sectional view, the hypotenuse length of the rectangular groove 16B is defined as S (as shown in FIG. 5, that is, the diagonal length of the rectangular groove 16B from the sectional view), that is, the hypotenuse length $S=(w^2+H^2)^{1/2}$. In the sectional view of FIG. 5, a triangle TR is formed by taking the width W and the depth H of the rectangular groove 16B as two sides, and the third side of the triangle TR is the hypotenuse S.

According to some embodiments, as shown in FIG. 5, a side dimension X on the side surface 21 in the sectional view of the disc-shaped light-emitting unit 18A can be designed to be larger than the length S of the hypotenuse of the rectangular groove 16B, so as to reduce the probability that the disc-shaped light-emitting unit 18A falls into the rectangular groove 16B during the fluid assembly procedure. In the sectional view of the disc-shaped light-emitting unit 18A, the alignment element 19 has a side 19a and a side 19b, the side 19a is a side closer to a side 21a of the disc-shaped light-emitting unit 18A, and the side 19b is a side farther to the side 21a. The positions of the side 19a, the side 19b and the side 21a described here refer to the relative positions shown in FIG. 5. The side dimension X is the distance from the side 21a of the disc-shaped light-emitting unit 18A to the side 19b of the alignment element 19. The side dimension X is R/2+r/2, that is, (R+r)/2. When the condition of side dimension X larger than the hypotenuse length S, i.e., $(R+r)/2>(w^2+H^2)^{1/2}$ is satisfied, it means that the side dimension X (i.e., R/2+r/2) of the disc-shaped light-emitting unit 18A will be larger than the hypotenuse length S of the rectangular groove 16B. That is, even if the disc-shaped light-emitting unit 18A partially falls into the rectangular groove 16B, because the side dimension X of the disc-shaped light-emitting unit 18A is larger than the hypotenuse S of the rectangular groove 16B, the probability that the disc-shaped light-emitting unit 18A is stuck in the rectangular groove 16B can be reduced. And during the fluid assembly procedure, the disc-shaped light-emitting unit 18A has the opportunity to move out of the rectangular groove 16B with the fluid again.

In this disclosure, the diameter R of the disc-shaped light-emitting unit 18A can be in a range from 30 μm to 60 μm, the width W of the rectangular groove 16B can be in a range from 10 μm to 20 μm, and the depth H of the rectangular groove 16B can be in a range from 10 μm to 20 μm. But the present disclosure is not limited thereto.

In addition, each disc-shaped light-emitting unit 18A may enter the rectangular groove in the direction from the side surface 21 (refer to the side surface 21 shown in FIG. 3) or in the vertical direction. That is, the side surface 21 of the main body 17 of the disc-shaped light-emitting unit 18A enters the rectangular groove 16B toward the −Z direction.

Figure 6:
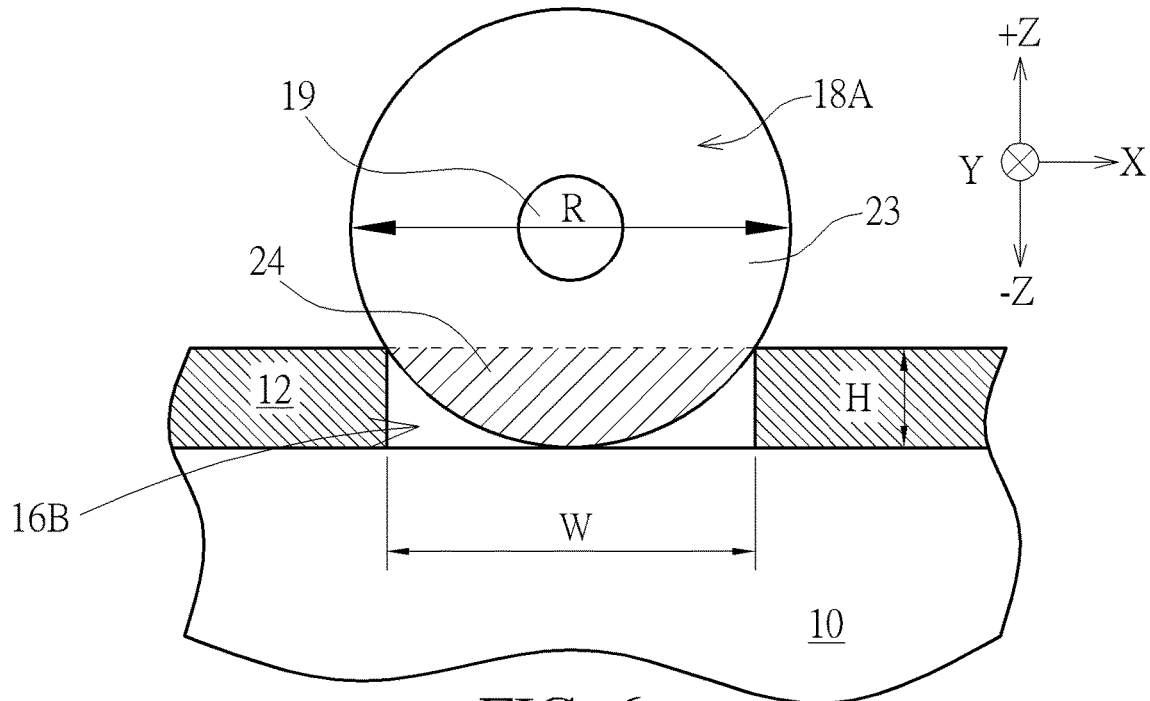
FIG. 6 shows a case where the disc-shaped light-emitting unit enters the rectangular groove in the lateral direction.

FIG. 6 shows a condition where the disc-shaped light-emitting unit 18A enters the rectangular groove 16B in the lateral direction or the vertical direction. In this embodiment, the size of the area where the disc-shaped light-emitting unit 18A falls into the rectangular groove 16B, that is, the partial area 24 marked by diagonal lines in FIG. 6, will affect the success rate of mounting the disc-shaped light-emitting unit 18A in the circular groove 16A in the fluid assembly procedure. Furthermore, in the fluid assembly procedure, according to some embodiments, even if the aforementioned condition $(R+r)/2>(w^2+H^2)^{1/2}$ has been satisfied, some of the disc-shaped light-emitting units 18A may still fall into the rectangular groove 16B in the lateral direction and be stuck in the rectangular groove 16B. Therefore, in this disclosure, the relationship between the area of the partial area 24 of the disc-shaped light-emitting unit 18A and the size of the rectangular groove 16B is adjusted. For example, in the sectional view, the partial area 24 of the disc-shaped light-emitting unit 18A, which falls into the rectangular groove 16B, can be designed to be less than 50% of the total cross-sectional area of the rectangular groove 16B. Thus, by the above design, even if the disc-shaped light-emitting unit 18A partially falls into the rectangular groove 16B, it can easily move out of the rectangular groove 16B again by the fluid. In addition, according to the experimental results, by adjusting the proportional relationship between the depth H of the rectangular groove 16B and the diameter of the disc-shaped light-emitting unit 18A, when the condition of $H/(R/2)<0.292$ is satisfied, the ratio of the partial area 24 of the disc-shaped light-emitting unit 18A to the cross-sectional area of the rectangular groove 16B is appropriate, which can reduce the probability that the disc-shaped light-emitting unit 18A is stuck by the rectangular groove 16B when flowing in the fluid. The depth H of the rectangular groove 16B and the diameter R of the disc-shaped light-emitting unit 18A are designed in a certain proportion, which can also reduce the probability that the light-emitting efficiency of the rectangular light-emitting unit 18B is too low when repairing because the sizes of the rectangular groove 16B and the rectangular light-emitting unit 18B are too small.

In summary, according to some embodiments, the grooves of different shapes are provided on the driving substrate of the electronic device, which respectively correspond to different shapes of light-emitting units and different mounting methods. For example, according to some embodiments, a large number of disc-shaped light-emitting units are mounted in circular grooves by a fluid assembly procedure, and then a small number of rectangular light-emitting units are mounted in some rectangular grooves by a pick-and-place procedure, so as to achieve the effect of repairing defects. In addition, according to some embodiments, the size relationship between the rectangular groove and the disc-shaped light-emitting unit can be designed, the possibility that the disc-shaped light-emitting unit falls into the rectangular groove in the fluid assembly procedure can be reduced, and the manufacturing efficiency can also be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
   a driving substrate, comprising a plurality of circular grooves and a plurality of rectangular grooves;
   a plurality of disc-shaped light-emitting units, wherein a disc-shaped light-emitting unit of the plurality of disc-shaped light-emitting units is disposed in a circular groove of the plurality of circular grooves, and the disc-shaped light-emitting unit comprises an alignment element positioned on a top surface of the disc-shaped light-emitting unit; and
   a plurality of rectangular light-emitting units;
   wherein the driving substrate includes a first pixel region and a second pixel region, and the plurality of rectangular grooves comprises a first rectangular groove disposed in the first pixel region and a second rectangular groove disposed in the second pixel region, and
   wherein a rectangular light-emitting unit of the plurality of rectangular light-emitting units is disposed in the first rectangular groove in the first pixel region, and the second rectangular groove in the second pixel region is not received with any one of the plurality of rectangular light-emitting units;
   wherein a diameter of the disc-shaped light-emitting unit is defined as R, a diameter of the alignment element is defined as r, a width of the first rectangular groove is defined as w, and a height of the first rectangular groove is defined as h, and the disc-shaped light-emitting unit and the first rectangular groove satisfy the condition of $(R+r)/2>(w^2+H^2)^{1/2}$.

2. The electronic device according to claim 1, wherein the disc-shaped light-emitting units are disposed in the circular grooves by a fluid assembly procedure.

3. The electronic device according to claim 1, wherein the rectangular light-emitting unit is disposed in the first rectangular groove by a pick-and-place procedure.

4. The electronic device according to claim 1, wherein the disc-shaped light-emitting unit and the first rectangular groove further satisfy the condition of $H/(R/2)<0.292$.

5. The electronic device according to claim 1, wherein the driving substrate comprises a plurality of pixel regions, wherein the disc-shaped light-emitting unit disposed in the circular groove is disposed in the second pixel region.

* * * * *